United States Patent
Ruffell et al.

(10) Patent No.: US 10,204,909 B2
(45) Date of Patent: Feb. 12, 2019

(54) NON-UNIFORM GATE OXIDE THICKNESS FOR DRAM DEVICE

(71) Applicant: Varian Semiconductor Equipment Associates, Inc., Gloucester, MA (US)

(72) Inventors: Simon Ruffell, South Hamilton, MA (US); Arvind Kumar, Manchester, MA (US); Tristan Ma, Lexington, MA (US); Kyu-Ha Shim, Andover, MA (US); John Hautala, Beverly, MA (US); Steven Sherman, Newton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/978,305

(22) Filed: Dec. 22, 2015

(65) Prior Publication Data

US 2017/0179133 A1 Jun. 22, 2017

(51) Int. Cl.
*H01L 27/088* (2006.01)
*H01L 27/108* (2006.01)
(Continued)

(52) U.S. Cl.
CPC .. *H01L 27/10826* (2013.01); *H01L 21/02238* (2013.01); *H01L 21/02252* (2013.01);
(Continued)

(58) Field of Classification Search
CPC ......... H01L 27/10826; H01L 29/42368; H01L 21/26586; H01L 21/28167;
(Continued)

(56) References Cited

U.S. PATENT DOCUMENTS 6,599,810 B1 * 7/2003 Kepler ............. H01L 21/76235
257/E21.55
9,023,720 B2 5/2015 Fuse et al.
(Continued)

FOREIGN PATENT DOCUMENTS

KR 1020120020062 A 3/2012

OTHER PUBLICATIONS

Y. Kawai, et al., Ultra-low-temperature growth of high-integrity gate oxide film by low-energy ion-assisted oxidation, Applied Physics Letters, 1994, pp. 2223-2225, vol. 64.
(Continued)

*Primary Examiner* — Thanh Y Tran

(57) ABSTRACT

Provided herein are approaches for forming a gate oxide layer for a DRAM device, the method including providing a finned substrate having a recess formed therein, and performing an ion implant into a sidewall surface of the recess to form a gate oxide layer having a non-uniform thickness, wherein a thickness of the gate oxide layer at a top section of the sidewall surface is greater than a thickness of the gate oxide layer at a bottom section of the sidewall surface. In some approaches, the ion implant is provided as a series of ion implants at multiple different implant angles, varied along with an ion implantation energy and/or an ion dose to increase the thickness of the gate oxide of the top section of the sidewall surface. In some approaches, the finned substrate is also exposed to a plasma, either during or after, the ion implantation.

14 Claims, 5 Drawing Sheets

(51) Int. Cl.
  *H01L 21/265* (2006.01)
  *H01L 21/28* (2006.01)
  *H01L 29/423* (2006.01)
  *H01L 21/02* (2006.01)
  *H01L 21/263* (2006.01)

(52) U.S. Cl.
  CPC .... *H01L 21/2633* (2013.01); *H01L 21/26586* (2013.01); *H01L 21/28167* (2013.01); *H01L 27/10879* (2013.01); *H01L 29/42368* (2013.01); *H01L 21/26506* (2013.01)

(58) Field of Classification Search
  CPC ............ H01L 27/10879; H01L 21/225; H01L 21/2253; H01L 21/02964; H01L 21/265; H01L 21/31155; H01L 21/425; H01L 21/76825; H01L 21/76859
  See application file for complete search history.

(56) References Cited

U.S. PATENT DOCUMENTS

| | | | | |
|---|---|---|---|---|
| 9,153,444 | B2* | 10/2015 | Zhang | H01L 21/28008 |
| 2003/0235959 | A1* | 12/2003 | Lichtenberger | H01L 29/7813 |
| | | | | 438/272 |
| 2004/0155341 | A1* | 8/2004 | Pipes | H01L 21/76237 |
| | | | | 257/751 |
| 2007/0249123 | A1* | 10/2007 | Chou | H01L 21/26586 |
| | | | | 438/270 |
| 2007/0259498 | A1* | 11/2007 | Chang | H01L 29/42368 |
| | | | | 438/270 |
| 2008/0128616 | A1* | 6/2008 | Kamiyanagi | G01N 23/227 |
| | | | | 250/307 |
| 2009/0184392 | A1* | 7/2009 | Cheng | H01L 21/26586 |
| | | | | 257/532 |
| 2009/0267161 | A1 | 10/2009 | Pillarisetty et al. | |
| 2011/0024841 | A1 | 2/2011 | Yang et al. | |
| 2012/0238046 | A1 | 9/2012 | Yu et al. | |
| 2014/0206197 | A1 | 7/2014 | Nakagawa et al. | |
| 2015/0200276 | A1* | 7/2015 | Cheng | H01L 29/66818 |
| | | | | 257/401 |
| 2016/0197075 | A1* | 7/2016 | Li | H01L 27/0924 |
| | | | | 257/369 |
| 2016/0379827 | A1* | 12/2016 | Ruffell | C23C 16/45536 |
| | | | | 438/563 |

OTHER PUBLICATIONS

Kee Kia Yaw, et al., Heavy ion implant to control gate oxide thickness, IEEE-RSM Proceedings Kota Bahru, Malaysia, 2009.

H. Oeschner, et al., Formation of intrinsic oxide layers by ion implantation of silicon and titanium in the low kiloelectronvolt regime, Materials Science and Engineering, 1991, pp. 214-210, vol. A139.

K. Das et al., Formation of buried oxide layers by high dose implantation of oxygens ions in silicon. Journal of Electronics Materials, 1984, pp. 635-654, vol. 13, Issue 4.

* cited by examiner

NON-UNIFORM GATE OXIDE THICKNESS FOR DRAM DEVICE

FIELD OF THE DISCLOSURE

The present embodiments relate to substrate patterning, and more particularly, to techniques for implanting a substrate with ions to form a gate oxide having a non-uniform thickness.

BACKGROUND OF THE DISCLOSURE

Plasma immersion ion implantation is performed by generating a plasma containing ions of species to be implanted in a semiconductor wafer or workpiece. The plasma may be generated using a plasma source, such as a toroidal plasma source, at the reactor chamber ceiling. Ion energy sufficient to achieve an intended ion implantation depth profile below the wafer surface is provided by coupling a very high RF bias voltage (e.g., 10 kV to 20 kV) to the semiconductor wafer through an insulated cathode electrode within the wafer support pedestal. High implant dose rate requires a high plasma ion density, achieved using a toroidal plasma source operating at a low chamber pressure. The requisite ion implant depth profile requires a very high ion energy, achieved by applying a very high RF bias voltage across the plasma sheath at the wafer surface. The process gas employed in plasma immersion ion implantation can be a fluoride or a hydride of the dopant species to be implanted.

In DRAM/flash memory fabrication, implanting a semiconductor dopant species into the polycrystalline silicon (polysilicon) gate electrodes beneficially increases conductivity. The gate electrodes are formed by depositing amorphous silicon on a thin gate oxide layer and then annealing the wafer sufficiently to transform the deposited silicon from the amorphous state to a polycrystalline state. The polycrystalline silicon gate layer thus formed is about 50 nm to 80 nm thick. The implanted species is one promoting p-type conductivity in silicon, such as boron, or n-type conductivity, such as arsenic, phosphorous or antimony. The gate electrode can also be made by certain metals such as TiN or W.

Long refresh time in DRAM is influential for device function. Refresh time is directly proportional to the amount of time charge can be held in DRAM cells. Thus, minimizing the cell junction leakage increases the charge retention time. Gate induced drain leakage (GIDL) is the primary mechanism for junction leakage. Thickening the gate oxide layer at the location of maximum GIDL will reduce overall junction leakage and increase charge retention time.

On the other hand, the layer thickness of the gate oxide continues to be reduced in order to provide suitable gate control over the sub-threshold region. Also, increasing doping density in the channel and source/drain regions advantageously improves punch through characteristics and increase drives. Thus, difficulties exist in providing a scaled down semiconductor device having a suitable balance between high current driving capability and low GIDL current.

SUMMARY OF THE DISCLOSURE

In view of the foregoing, what is needed are methods for improving GIDL in DRAM access devices by providing a non-uniform gate oxide having an area of increased thickness. In one approach, a process for reducing GIDL includes providing a finned substrate having a recess formed therein, and performing an ion implant into a sidewall surface of the recess to form a gate oxide layer having a non-uniform thickness, wherein a thickness of the gate oxide layer at a top section of the sidewall surface is greater than a thickness of the gate oxide layer at a bottom section of the sidewall surface. In some embodiments, approaches further include performing a series of ion implants at multiple different implant angles, varied during the series of ion implants along with an ion implantation energy and/or an ion dose, to increase the thickness of the gate oxide of the top section of the sidewall surface. In some embodiments, the finned substrate is also exposed to a plasma, either during or after, the ion implantation.

In some embodiments, a method of forming a dynamic random access memory (DRAM) device includes providing a finned substrate having a recess formed therein, and performing an ion implant into a sidewall surface of the recess to form a gate oxide layer having a non-uniform thickness, wherein a thickness of the gate oxide layer at a top section of the sidewall surface is greater than a thickness of the gate oxide layer at a bottom section of the sidewall surface.

In some embodiments, a method of forming a gate oxide layer for a dynamic random access memory (DRAM) device includes providing a finned substrate having a recess formed therein, and performing a series of ion implants into a sidewall surface of the recess to form a gate oxide layer having a non-uniform thickness. The series of ion implants impacts the sidewall surface at multiple different implant angles to form the gate oxide layer with a thickness at a top section of the sidewall surface greater than a thickness of the gate oxide layer at a bottom section of the sidewall surface.

In some embodiments, a dynamic random access memory (DRAM) device includes a set of fins defining a recess in a substrate, the recess having a sidewall surface and a bottom surface, and a gate oxide formed along the sidewall surface and the bottom surface of the recess. A thickness of the gate oxide along a top section of the sidewall surface is greater than a thickness of the gate oxide along a bottom section of the sidewall surface.

Figure 1:
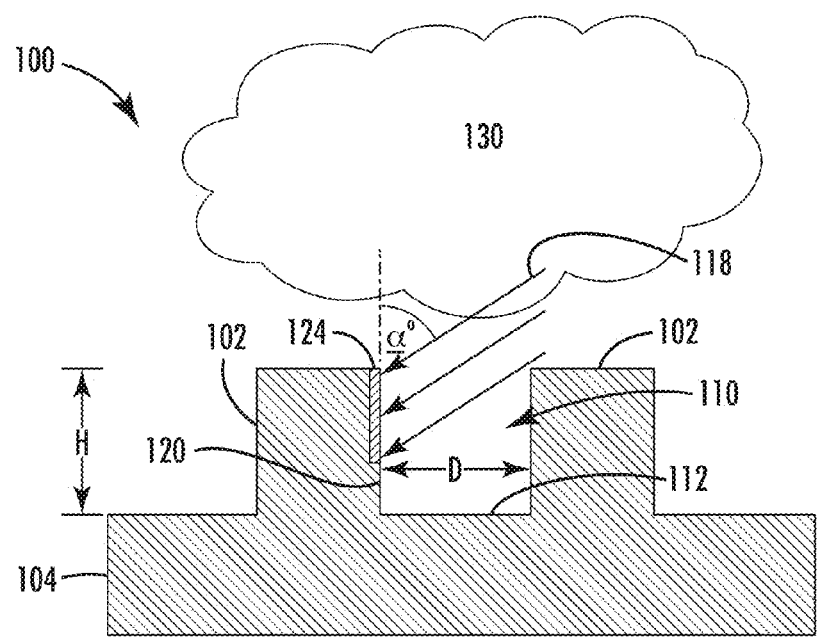
FIG. 1 depicts a side cross-sectional view of an approach for treating a finned substrate in accordance with an embodiment of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods in accordance with the present disclosure will now be described more fully hereinafter with reference to the accompanying drawings, where embodiments of the methods are shown. The method may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts with respect to the geometry and orientation of a component of a semiconductor manufacturing device as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

As further described herein, provided are approaches for forming a gate oxide layer for a semiconductor device (e.g., DRAM), the method including providing a finned substrate having a recess formed therein, and performing an ion implant into a sidewall surface of the recess to form a gate oxide layer having a non-uniform thickness, wherein a thickness of the gate oxide layer at a top section of the sidewall surface is greater than a thickness of the gate oxide layer at a bottom section of the sidewall surface. In some embodiments, approaches further include performing a series of ion implants at multiple different implant angles, varied during the series of ion implants along with an ion implantation energy and/or an ion dose to increase the thickness of the gate oxide of the top section of the sidewall surface. In some embodiments, the finned substrate is also exposed to a plasma, either during or after, the ion implantation. As a result, unlike a prior art thermally based DRAM gate oxide process, requiring heating of wafers to >800° C., ion-beam based implementations provided herein form an oxide with local variation in thickness, achieved at a lower temperature.

Turning now to FIG. 1, there is shown a cross-sectional view of an approach for forming a device 100 (e.g., a DRAM device) according to embodiments of the disclosure. The device 100 comprises a substrate 104 (e.g., bulk silicon) and a plurality of fins 102 patterned (e.g., etched) from the substrate 104. The fins 102 may be fabricated using any suitable process including one or more photolithography and etch processes. As further shown, the set of fins 102 define a recess 110 formed therebetween, the recess 110 including a bottom surface 112 and a set of sidewalls 120.

The photolithography process for forming the set of fins 102 may include forming a photoresist layer (not shown) overlying the substrate 104 (e.g., on a silicon layer), exposing the resist to a pattern, performing post-exposure bake processes, and developing the resist to form a masking element including the resist. The masking element may then be used to etch the fins 102 into the silicon layer, e.g., using reactive ion etch (RIE) and/or other suitable processes. In one embodiment, the fins 102 are formed using a sidewall image transfer technique. In another embodiment, the fins 102 are formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including, but not limited to, double exposure (e.g., using two mask sets), forming spacers adjacent features and removing the features to provide a pattern of spacers, resist freezing, and/or other suitable processes.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present embodiments. For example, the semiconductor substrate may comprise a semiconductor wafer (e.g., silicon, SiGe, or an SOI wafer) or one or more die on a wafer, and any epitaxial layers or other type semiconductor layers formed there over or associated therewith. A portion or entire semiconductor substrate may be amorphous, polycrystalline, or single-crystalline. In addition to the aforementioned types of semiconductor substrates, the semiconductor substrate employed in the present embodiments may also comprise a hybrid oriented (HOT) semiconductor substrate having surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

In some embodiments, the set of fins 102 may have a uniform height 'H' across the wafer, as well as a uniform distance 'D' between adjacent fins. Because the geometries of the set of fins 102 are generally constant across the wafer, the set of fins 102 may be used to shadow the space between the fins 102. In one embodiment, an ion incidence implant angle 'α' of an ion implantation 118 may be chosen in such a way so just an intended portion of the sidewall surface 120 of the fins 102 is implanted. Meanwhile, the bottom surface 112 of the recess 110 is generally unaffected.

As further shown in FIG. 1, the ion implantation 118 to the sidewall surface 120 of the set of fins 102 forms an oxide layer 124 (e.g., $SiO_2$). In exemplary embodiments, the ion implantation 118 is performed at an implant angle 'α' nonparallel with the sidewall surface 120. For example, the ion implantation 118 may impart ions at approximately 30° incidence angle to the sidewall surface 120 (or approximately 60° relative to a plane normal to the sidewall surface 120) to form the oxide layer 124 along just a portion of the sidewall surface 120. The implantation angle may vary in other embodiments by +/−15°.

During operation, the ion implantation 118 may be performed while the device 100 is in a first position, for example as shown in FIG. 1. Following formation of the oxide layer 124 along the sidewall surface 120, the device 100 is rotated (e.g., by 30, 45, 60, or 90 degrees), and another ion implantation may be applied to the device 100 to form the oxide layer 124 along one or more additional sidewall surfaces of the set of fins 102. In exemplary embodiments, the oxide layer 124 is again formed just along a portion of the sidewall surface 120 of the fins 102. The ion implantation may similarly be performed at an implant approximately 60° incidence angle to the sidewall surface 120 (or approximately 30° relative to a plane normal to the sidewall surface 120).

In various embodiments, the ion implantation 118 may be performed before, or simultaneously with, a plasma exposure 130. For example, in the case of an Ar implantation for surface activation followed by $O_2$ plasma exposure, the wafer may cycle between an ion beam generator and an $O_2$ plasma source (not shown). In the case of simultaneous surface activation and plasma exposure, the growth process to form the oxide layer 124 is activated by a low energy (e.g., ~10-100 eV) Ar ion-bombardment of the sidewall surface 120 whilst the surface is subjected to an O plasma. The Ar ion-irradiated implant reduces the activation energy of Si oxidation so oxidation readily occurs at a low temperature. Meanwhile, the Ar beam of the ion implantation 118 can be directed at an angle so oxidation occurs just where the Si surface is irradiated with the beam on certain parts of the sidewall surface 120, e.g., an area corresponding to the oxide layer 124 shown in FIG. 1.

In some embodiments, the ion energy is low enough to eliminate damage to the crystalline Si of the substrate 104 and to maintain good structural integrity of the oxide. For example, a high quality stoichiometric Si-oxide with no end-of-range of damage to the underlying Si may be formed at 450° C. In one non-limiting embodiment, ion implantation may be provided by a beamline ion-implanter, a beamline implanter with modified end-station containing a remote O plasma source, or a modified beamline implanter delivering a beam of multiple 10s of eV energy.

Figure 2:
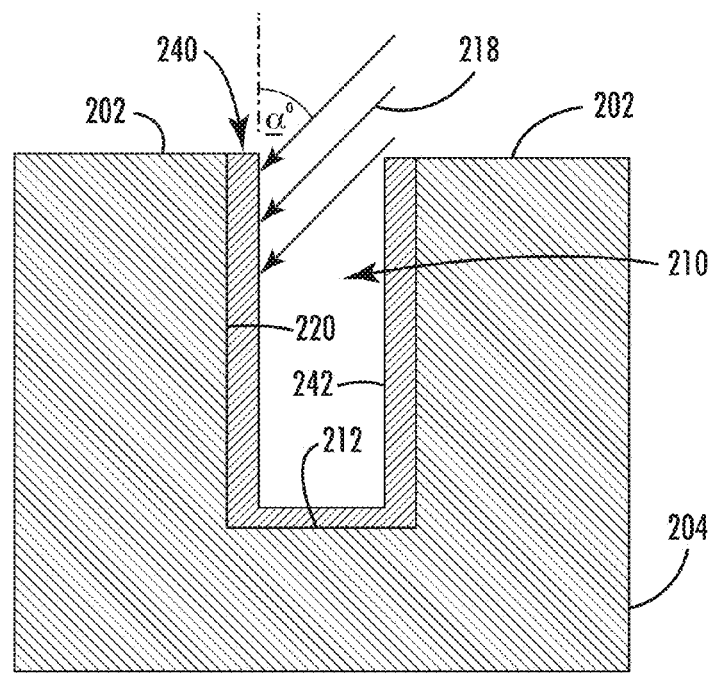
FIG. 2 depicts a side cross-sectional view of an approach for implanting ions into a sidewall surface of a recess of a finned substrate in accordance with an embodiment of the present disclosure.
Figure 3:
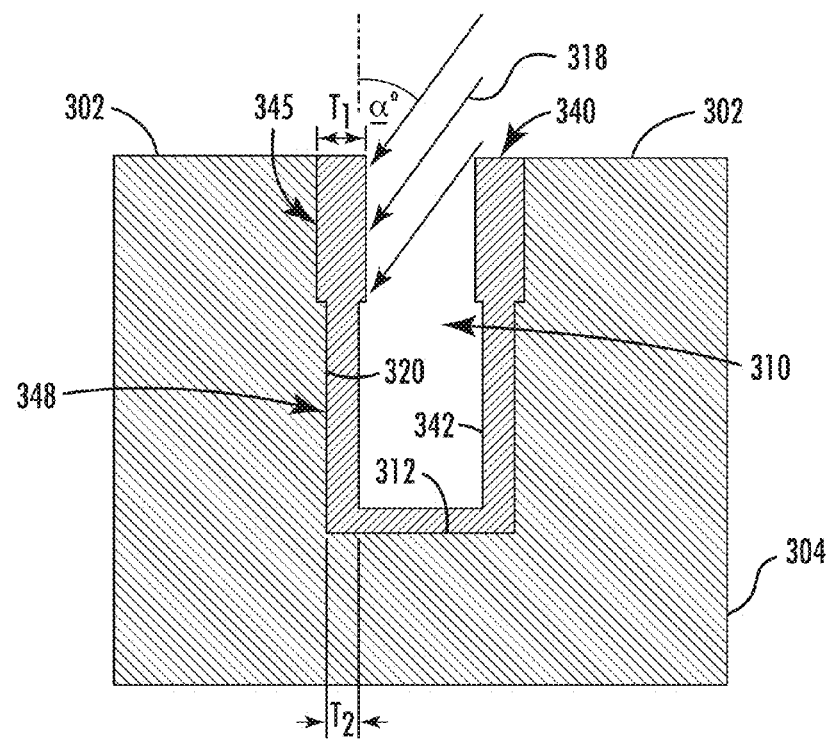
FIG. 3 depicts a side cross-sectional view of an approach for forming a non-uniform gate oxide along a sidewall surface of a finned substrate in accordance with embodiments of the present disclosure.

Referring now to FIGS. 2-3, formation of a gate oxide layer within a recess 210 of a device 200 will be described in greater detail. As shown, formation of the gate oxide layer 240 may include forming a base oxide layer 242 along the sidewall surface 220 and the bottom surface 212 within the recess 210. In various embodiments, the base oxide layer 242 may be conformally deposited within the recess 210, wherein "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

As further shown, an ion implantation 218 may be performed to the sidewall surface 220 of the set of fins 202. In exemplary embodiments, the ion implantation 218 is performed at an implant angle 'α' nonparallel with the sidewall surface 220 so as to impact just a portion of the sidewall surface 220. As shown in FIG. 3, this results in a gate oxide layer 340 having a non-uniform thickness in the areas of the sidewall surface 320 impacted by the ion implantation 318. For example, a thickness $T_1$ of the gate oxide layer 340 at a top section 345 of the recess 310 is greater than a thickness $T_2$ of the gate oxide layer 340 at a bottom section 348 of the recess 310. This localized, relatively thicker top section 345 of the gate oxide layer 340 advantageously reduces GIDL.

Figure 4:
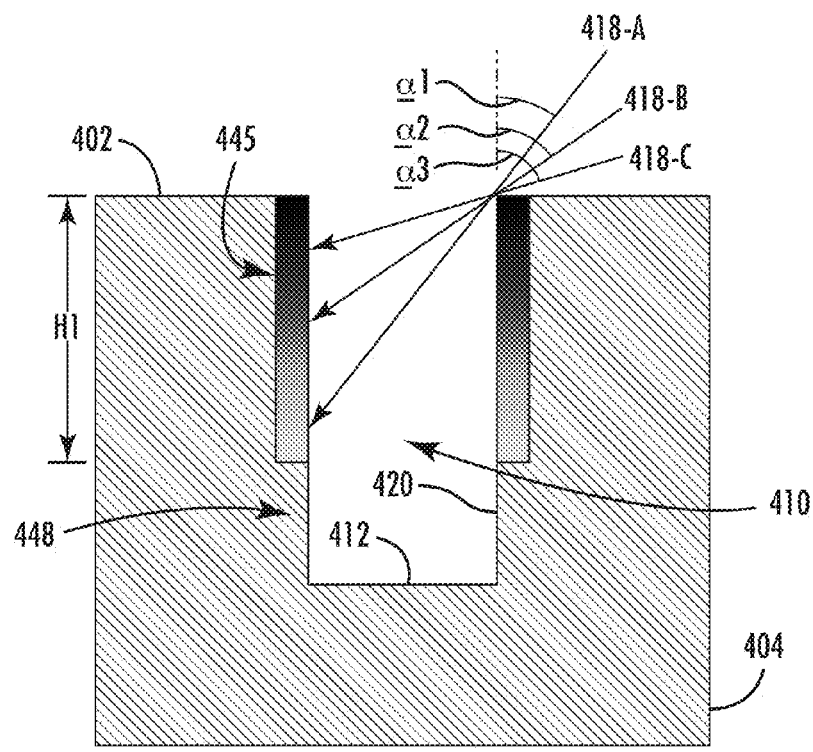
FIG. 4 depicts a side cross-sectional view of a series of sidewall implants performed at varying angles in accordance with an embodiment of the present disclosure.
Figure 5:
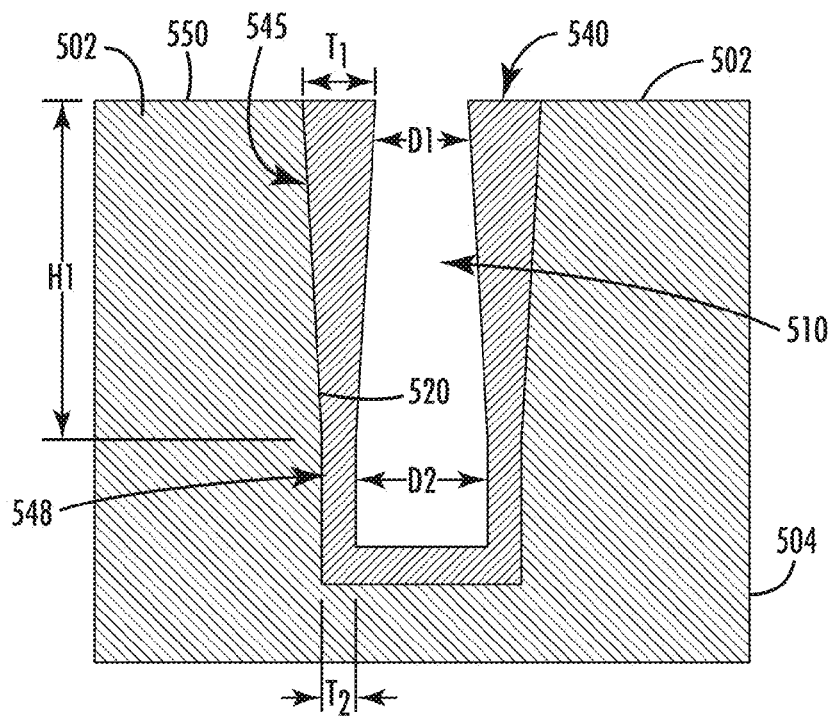
FIG. 5 depicts a side cross-sectional view of a non-uniform gate oxide formed along a sidewall surface of a finned substrate in accordance with embodiments of the present disclosure.

Referring now to FIGS. 4-5, an embodiment for performing a series of ion implants at varying implant angles will be described in greater detail. In this embodiment, ion implantation energy and/or ion dose may also be varied during performance of the series of ion implantations 418A-C to the sidewall surface 420 to form an oxide layer 440 with a dose gradient varying along a height 'H1' of the top section 445 of the recess 410. As a result, a thermal oxide layer with variable thickness may be produced due to the difference in oxide growth rates. Furthermore, the energy of the series of ion implantations 418A-C may be chosen in such a way so all the damaged Si will be consumed during oxidation, thus minimizing leakage from end-of-range damage.

For example, as shown in FIG. 4, the series of ion implantations 418A-C may be performed to the sidewall surface 420 of the set of fins 402 at a variety of implant angles, $\alpha_{1-3}$. In exemplary embodiments, the first ion implantation 418-A is performed at an implant angle $\alpha_1$ and at a first implant energy/ion dose, the second ion implantation 418-B is performed at another implant angle $\alpha_2$ and implant energy/ion dose, and the third ion implantation 418-C is performed at yet another implant angle $\alpha_3$ and implant energy/ion dose. Each of the implant angles $\alpha_{1-3}$ is nonparallel with the sidewall surface 420 so as to impact various points along the top section 445 of the sidewall surface 420. As shown, the bottom section 448 of the sidewall surface 420 remains generally unaffected by the series of ion implantations 418A-C.

As shown in FIG. 5, the varied ion implant results in a gate oxide layer 540 having a non-uniform thickness, wherein a thickness T1 of the gate oxide layer 540 at a top section 545 is greater than a thickness T2 of the gate oxide layer 540 at the bottom section 548. More specifically, the thickness of the oxide varies along the top section 545 so the gate oxide layer 540 is thickest proximate a top surface 550 of the fins 502. As shown, a diameter D1 of the recess 510 proximate the top section 545 is smaller than a diameter D2 of the recess 510 proximate the bottom section 548. To achieve this oxide profile, the ion implantation energy and the ion dose may be increased as the implant angle (e.g., $\alpha_{1-3}$) decreases over the series of ion implants 418A-C (FIG. 4). For example, the ion implantation energy and/or the ion dose of the ion implantation 418-C may be greater than the ion implantation energy and/or the ion does of the ion implantation 418-A.

Figure 6:
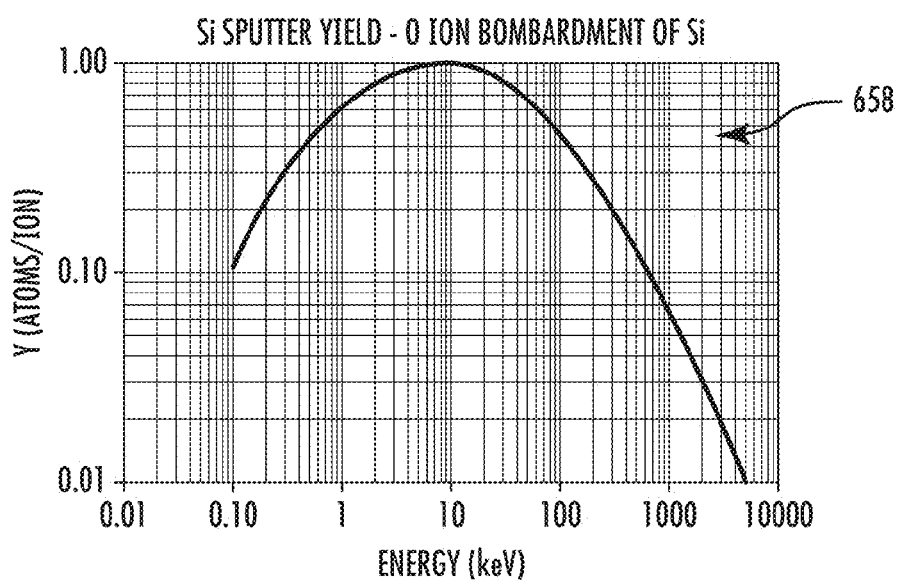
FIG. 6 depicts a graph illustrating the sputter yield of Si under irradiation of an ion beam in accordance with an embodiment of the present disclosure.
Figure 7A:
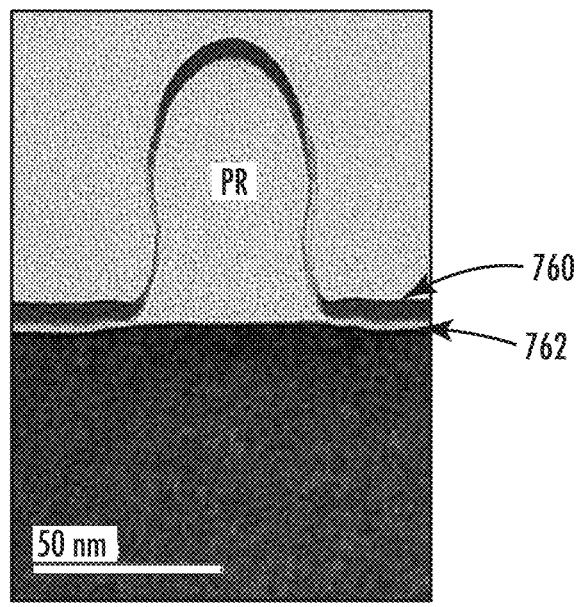
FIGS. 7A-B depict growth of an oxide layer after an ion implant in accordance with an embodiment of the present disclosure.
Figure 7B:
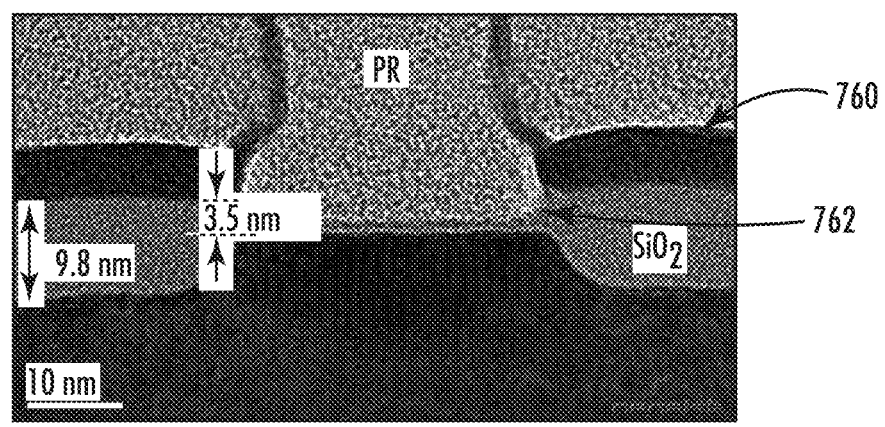

Referring now to FIG. 6, shown is a graph 658 illustrating the sputter yield of Si under irradiation of an O ion beam, such as an ion beam of the ion implantations shown in FIGS. 1-5. In this non-limiting embodiment, the maximum Si removal rate is set at 10 keV. In addition, with the implantation of O, there may be a volume expansion due to the formation of $SiO_2$, for example, to counter the loss of Si due to sputtering. The transmission electron microscopy (TEM) images of FIGS. 7A-B demonstrate, after O implant at 1 keV, the top surface 760 grows 3.5 nm above the interface 762, e.g., instead of having a recess due to loss by sputtering.

Figure 8:
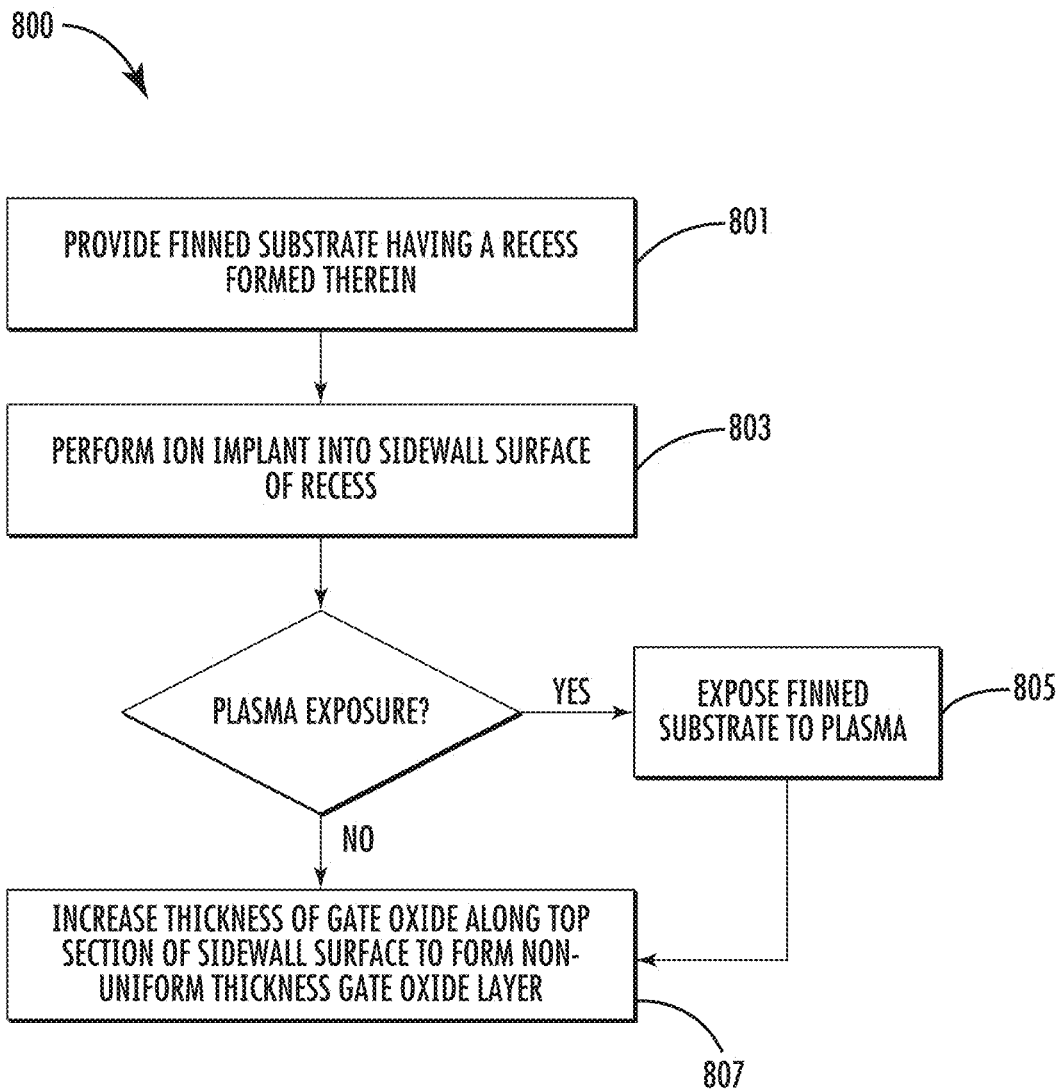
FIG. 8 is a flowchart illustrating an exemplary method according to the present disclosure.

Referring now to FIG. 8, a flow diagram illustrating an exemplary method 800 for patterning a semiconductor device in accordance with the present disclosure is shown. The method 800 will be described in conjunction with the representations shown in FIGS. 1-7.

Method 800 may include providing a finned substrate having a recess formed therein, as shown in block 801. In some embodiments, the finned substrate is silicon.

The method 800 may further include performing an ion implant into a sidewall surface of the recess to form a gate oxide layer having a non-uniform thickness, as shown in block 803. In some embodiments, a thickness of the gate oxide layer at a top section of the recess is greater than a thickness of the gate oxide layer at a bottom section of the recess. In some embodiments, the ion implant is performed as a series of ion implants having multiple different implant angles. In some embodiments, the method 800 includes varying at least one of the following during performance of the series of ion implants: an ion implantation energy, and an ion dose. In some embodiments, the ion implantation energy and the ion dose is increased over the series of ion implants as the implant angle decreases, wherein the implant angle is measured relative to the sidewall surface.

The method 800 may further include exposing the finned substrate to a plasma, as shown at block 805. In some embodiments, the plasma exposure and ion implant may be simultaneous. In other embodiments, the ion implant is performed prior to the plasma exposure.

The method 800 may further include increasing the thickness of the gate oxide along the top section of sidewall surface of the sidewall surface to form a non-uniform thickness gate oxide layer, as shown in block 807. In some embodiments, the thickness of the gate oxide is greatest proximate a top surface of the finned substrate.

In view of the foregoing, at least the following advantages are achieved by the embodiments disclosed herein. A first advantage includes angling an ion implant directed to a sidewall surface of a fin to allow local growth of a gate oxide layer, thus decreasing GIDL. A second advantage includes implanting the device at an ion energy low enough to eliminate damage to the crystalline Si of the substrate, yet maintain good structural integrity of the oxide.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

The invention claimed is:

1. A method of forming a dynamic random access memory device (DRAM) device, the method comprising:
providing a finned substrate having a recess formed therein;
forming a base oxide layer along a sidewall surface and a bottom surface of the recess; and
performing an ion implant into just a portion of the base oxide layer at a top section of the sidewall surface to form a gate oxide layer along the sidewall surface having a non-uniform thickness, wherein a thickness of the gate oxide layer at the top section of the sidewall surface is greater than a thickness of the base oxide layer at a bottom section of the sidewall surface.

2. The method of claim 1, further comprising performing a series of ion implants at multiple different implant angles.

3. The method according to claim 2, further comprising varying at least one of the following during performance of the series of ion implants: an ion implantation energy, and an ion dose.

4. The method according to claim 3, further comprising increasing the ion implantation energy and the ion dose over the series of ion implants as an implant angle decreases, wherein the implant angle is measured relative to the sidewall surface.

5. The method according to claim 3, further comprising increasing the thickness of the gate oxide along the top section of the sidewall surface, wherein the thickness of the gate oxide layer is greatest proximate a top surface of the finned substrate.

6. The method according to claim 2, further comprising exposing the finned substrate to a plasma.

7. The method according to claim 6, further comprising simultaneously exposing the finned substrate to the plasma and performing the series of ion implants to the sidewall surface of the recess.

8. The method according to claim 6, further comprising performing at least one of the series of ion implants prior to exposing the finned substrate to the plasma.

9. A method of forming a gate oxide layer for a memory device, comprising:
providing a finned substrate having a recess formed therein;
forming a base oxide layer along a sidewall surface and a bottom surface of the recess; and
performing a series of ion implants into just a portion of the sidewall surface of the recess after formation of the base oxide layer at a top section of the sidewall surface to form a gate oxide layer along the sidewall surface having a non-uniform thickness, wherein the series of ion implants impact the sidewall surface at multiple different implant angles to form the gate oxide layer with a thickness at a top section of the sidewall surface greater than a thickness of the base oxide layer at a bottom section of the sidewall surface.

10. The method according to claim 9, further comprising varying at least one of the following during performance of the series of ion implants: an ion implantation energy, and an ion dose.

11. The method according to claim 10, further comprising increasing the ion implantation energy and the ion dose over the series of ion implants as an implant angle decreases, wherein the implant angle is measured relative to the sidewall surface.

12. The method according to claim 9, further comprising exposing the finned substrate to a plasma.

13. The method according to claim 12, further comprising simultaneously exposing the finned substrate to the plasma and performing the series of ion implants to the sidewall surface of the recess.

14. The method according to claim 12, further comprising performing at least one of the series of ion implants prior to exposing the finned substrate to the plasma.

* * * * *